(12) United States Patent
Bostick et al.

(10) Patent No.: US 7,986,791 B2
(45) Date of Patent: Jul. 26, 2011

(54) METHOD AND SYSTEM FOR AUTOMATICALLY MUTING HEADPHONES

(75) Inventors: James Edward Bostick, Cedar Park, TX (US); Brian Wayne Hansen, Round Rock, TX (US); Raghuraman Kalyanaraman, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1317 days.

(21) Appl. No.: 11/550,000

(22) Filed: Oct. 17, 2006

(65) Prior Publication Data
US 2008/0089530 A1 Apr. 17, 2008

(51) Int. Cl.
*G10K 11/16* (2006.01)
*H03B 29/00* (2006.01)
*A61F 11/06* (2006.01)

(52) U.S. Cl. .......................................... 381/71.6; 381/72
(58) Field of Classification Search ............. 381/55–59, 381/74, 72, 94.5, 98, 71.1, 71.6
See application file for complete search history.

(56) References Cited

U.S. PATENT DOCUMENTS

| | | | |
|---|---|---|---|
| 5,182,774 A * | 1/1993 | Bourk | 381/71.6 |
| 6,104,819 A | 8/2000 | Nickum | |
| 6,771,780 B2 | 8/2004 | Hong et al. | |
| 7,010,098 B2 | 3/2006 | Moquin et al. | |
| 2001/0012792 A1 | 8/2001 | Murray | |
| 2004/0179694 A1 * | 9/2004 | Alley | 381/55 |

* cited by examiner

*Primary Examiner* — Ping Lee
(74) *Attorney, Agent, or Firm* — Yee & Associates, P.C.; Mark C. Vallone

(57) ABSTRACT

The illustrative embodiments provide a method and system for automatically muting a headphone. The headphone detects a sound external to the headphone. A volume threshold and a frequency threshold are received, wherein the volume threshold and the frequency threshold define a sound of interest. A determination is made as to whether the sound external to the headphone is the sound of interest. Responsive to a determination that the sound external to the headphone is the sound of interest, a signal is transmitted to automatically mute an active state of the headphone.

8 Claims, 3 Drawing Sheets

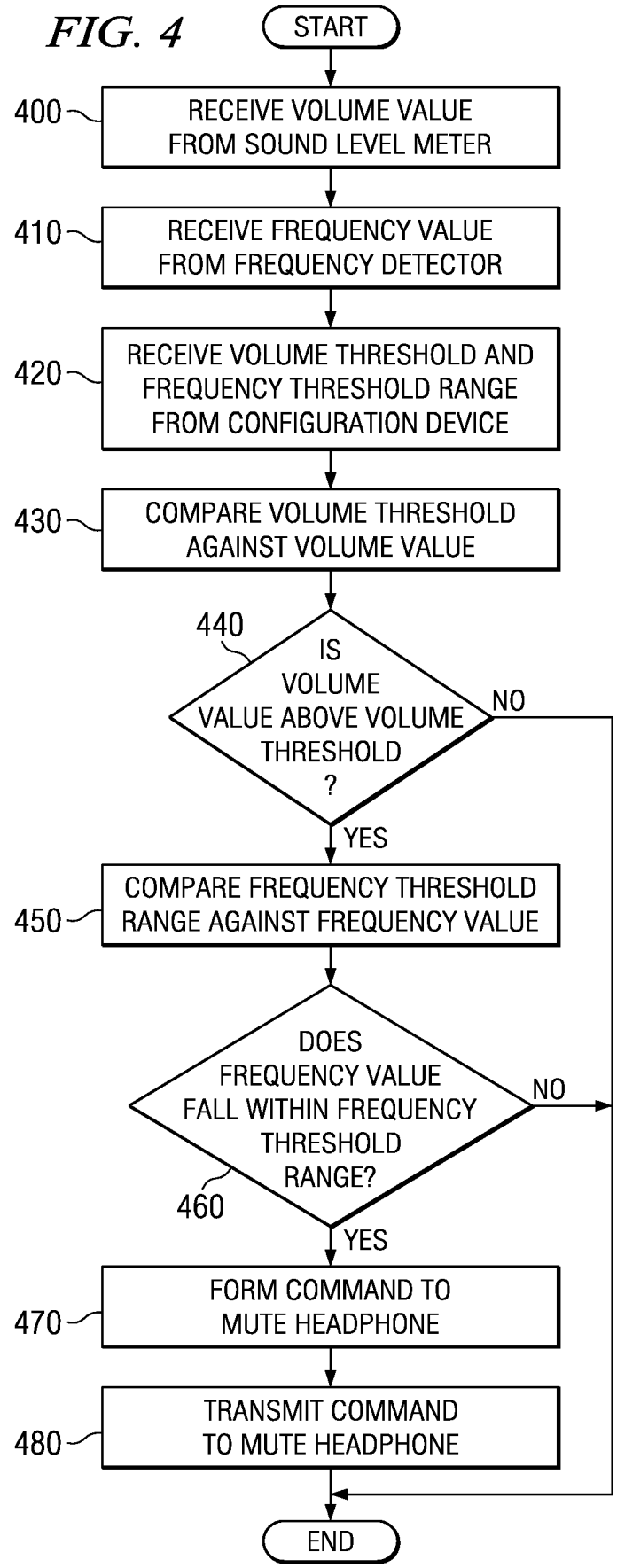

METHOD AND SYSTEM FOR AUTOMATICALLY MUTING HEADPHONES

BACKGROUND OF THE INVENTION

1. Field of the Invention

The present invention relates generally to a headphone. More specifically, the present invention relates to a method and system for automatically muting a headphone.

2. Description of the Related Art

Users often use headphones to privately listen to music and to block out and ignore unwanted background noise. However, in certain circumstances, some background noise is important for users to hear. For instance, in an emergency, a user wearing headphones may want to hear a fire alarm or tornado siren. In other instances, a user wearing headphones may want to participate in a particular conversation close to where the user is situated. Therefore, in order to hear the background noise, the user often has to turn the music down to a really low sound level or wear the headphones with only one earphone on the ear. However, as a result, the purpose of using the headphones is often defeated. Instead of blocking out unwanted background noise, the user resorts to only partial and sometimes no blocking out of any unwanted background noise.

SUMMARY OF THE INVENTION

The illustrative embodiments provide a method and system for automatically muting a headphone. The headphone detects a sound external to the headphone. A volume threshold and a frequency threshold are received, wherein the volume threshold and the frequency threshold define a sound of interest. A determination is made as to whether the sound external to the headphone is the sound of interest. Responsive to a determination that the sound external to the headphone is the sound of interest, a signal is transmitted to automatically mute an active state of the headphone.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is a flowchart illustrating the process for automatically muting a headphone, in accordance with an illustrative embodiment.

DETAILED DESCRIPTION OF THE PREFERRED EMBODIMENT

Figure 1:
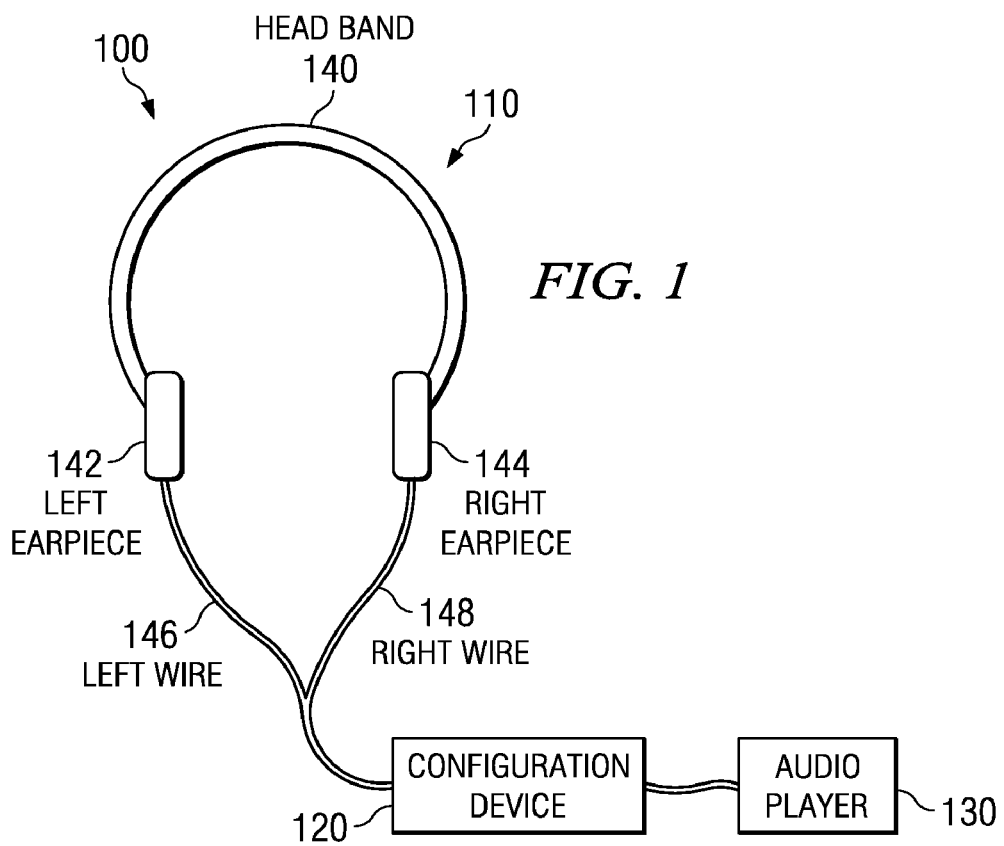
FIG. 1 illustrates a portable audio system, in which an illustrative embodiment may be implemented.

FIG. 1 illustrates a portable audio system, in which an illustrative embodiment may be implemented. Portable audio system 100 is a compact audio system that allows a user to privately listen to any audio device. Portable audio system 100 includes headphone 110, configuration device 120, and audio player 130. In the illustrative embodiment, headphone 110 directly connects to configuration device 120 which in turn connects to audio player 130. Headphone 110 is operatively connected to audio player 130. In other words, headphone 110 can functionally interact with audio player 130 and receive signals from audio player 130 but is not directly connected to audio player 130. Audio player 130 transmits signals to headphone 110 via configuration device 120. Portable audio system 100 is not limited to the illustrative embodiment, and, in another embodiment, headphone 110 may connect directly to audio player 130.

Headphone 110 is a pair of transducers that emanates a sound in close proximity to a user's ears. Headphone 110 includes headband 140, left earpiece 142, right earpiece 144, left wire 146, and right wire 148. Headband 140 connects left earpiece 142 to right earpiece 144. In the illustrative embodiment, headband 140 sits on the top of a user's head and positions left earpiece 142 over the user's left ear and right earpiece 144 over the user's right ear. However, headband 140 is not limited to the illustrative embodiment and may also be disposed in other positions relative to a user's head, such as on the back of the head or underneath the user's chin.

In the illustrative embodiment, left earpiece 142 and right earpiece 144 are circumaural earpieces, which are earpieces that include pads that surround the ears of a user. However, left earpiece 142 and right earpiece 144 may also be any other type of earpiece, including but not limited to (1) a supra-aural earpiece, which is an earpiece that is disposed on top of the ear of a user; (2) an earbud, which is an earpiece that is disposed directly outside of the ear canal of a user; or (3) a canalphone, which is an ear monitor that is disposed directly inside the ear canal. Depending on the type of earpiece, headband 140 may or may not also be included in the illustrative embodiment.

Left wire 146 and right wire 148 connect left earpiece 142 and right earpiece 144, respectively, to configuration device 120 and audio player 130. Left wire 146 and right wire 148 transmit electrical signals from audio player 130 and configuration device 120 to left earpiece 142 and right earpiece 144. Left earpiece 142 and right earpiece 144 translate the electrical sounds into audio sound waves, which are then transmitted to the ears of the user.

Configuration device 120 determines whether a sound external to headphone 110 is a sound of interest so that portable audio device 100 can be muted when portable audio device 100 is in an active state. A sound of interest is any sound external to headphone 110 about which the user of headphone 110 would want to know. For example, a sound of interest may be an activated siren or fire alarm. Another sound of interest may be an individual or group of individuals who may be trying to converse with the user.

Portable audio device 100 is in an active state when a sound signal, either audio or voice, is being transmitted from audio player 130. An active state also exists when a noise cancellation feature in headphone 110 is activated. Portable audio device 100 is muted when (1) a sound signal that is being transmitted from audio player 130 is stopped; (2) an active noise cancellation feature within headphone 110 is cancelled; or (3) the sound transmitters in left earpiece 142 and right earpiece 144 are deactivated.

A user defines a sound of interest through the volume and frequency of the sound. Volume is the intensity of a sound and is quantified in decibels (dB). A person can safely hear sounds with a volume ranging anywhere between 0 dB to 134 dB. Any sound above 134 dB is typically painful and can result in permanent hearing loss. The volume of a human voice ranges anywhere from 0 dB to 100 dB, with a whisper being approximately at 30 dB and a normal conversation between individuals distanced about four to five feet apart ranging between 40 dB to 60 dB. The volume of a fire alarm is typically around 90 dB to 100 dB.

Frequency is the pitch of a sound wave and is measured in hertz (Hz). The frequency of a sound is a constant value and does not depend on an individual's proximity relative to the sound. The human ear can detect sounds ranging anywhere from 20 Hz to 20,000 Hz. Speech frequency or the frequency at which an individual speaks typically ranges between 400 and 2000 Hz. The frequency of a fire alarm is approximately 3000 Hz.

Portable audio device 100 mutes when a sound of interest meets specified volume and frequency thresholds. A user establishes the volume and frequency thresholds at which headphone 110 is muted using configuration device 120. The automatic muting feature activates when headphone 110 detects a sound that is above the volume threshold and within the frequency threshold established by the user in configuration device 120.

In one embodiment, a user sets and adjusts the volume and frequency thresholds using configuration device 120. In another embodiment, configuration device 120 includes default settings with preset volume and frequency thresholds. In yet another embodiment, the automatic muting feature is completely deactivated. In still yet another embodiment, a time limit on how long the automatic mute function is activated may also be established. In the illustrative embodiment, the muting feature is active with the volume threshold set at 20 dB and the frequency threshold range set between 4,000 and 20,000 Hz. No time limit for the automatic muting function is set in the illustrative embodiment.

In the illustrative embodiment, configuration device 120 is a separate data processing system and is external to headphone 110. However, in another embodiment, configuration device 120 may be included internally within headphone 110 or combined with audio player 130. In yet another embodiment, configuration device 120 may also be implemented as a mechanical control, such as a knob, coupled directly to headphone 110 or to configuration device 120 itself.

Audio player 130 is any device that reads and transmits an audio signal. Generally, audio player 130 is any device capable of reading and transmitting an audio recording, such as a compact disk (CD) player, a tape player, an MP3® player, a wireless mobile telephone, a personal digital assistant (PDA), or a digital audio player. (MP3® is a registered trademark of Coby Electronics Corporation in the United States, other countries, or both.) Audio player 130 can play any type of audio recording, such as music or an audio book. In the illustrative embodiment, audio player 130 is a compact disk player that plays music.

In use, a user sets the volume and frequency thresholds and the duration for the automatic mute function using configuration device 120. The settings are saved in configuration device 120 and sent to a frequency detector and a decibel meter in headphone 110. The frequency detector and the decibel meter receive the sound waves of the sound of interest. If the sound of interest is above the volume threshold and within the range of frequency thresholds, a command is sent to mute headphone 110. In one embodiment, the command is sent to a volume controller in headphone 110 and mutes any sound being transmitted by audio player 130. In another embodiment, the command is sent to a noise cancellation controller in headphone 110 to cancel an active noise cancellation feature. In yet another embodiment, the command is sent to both the volume controller and the noise cancellation controller.

The illustrative embodiment is not limited to the depicted example. For example, configuration device 120 and audio player 130 may be a single device. Additionally, headphone 110 may include only an audio feature, only a noise cancellation feature, or both an audio and a noise cancellation feature.

Figure 2:
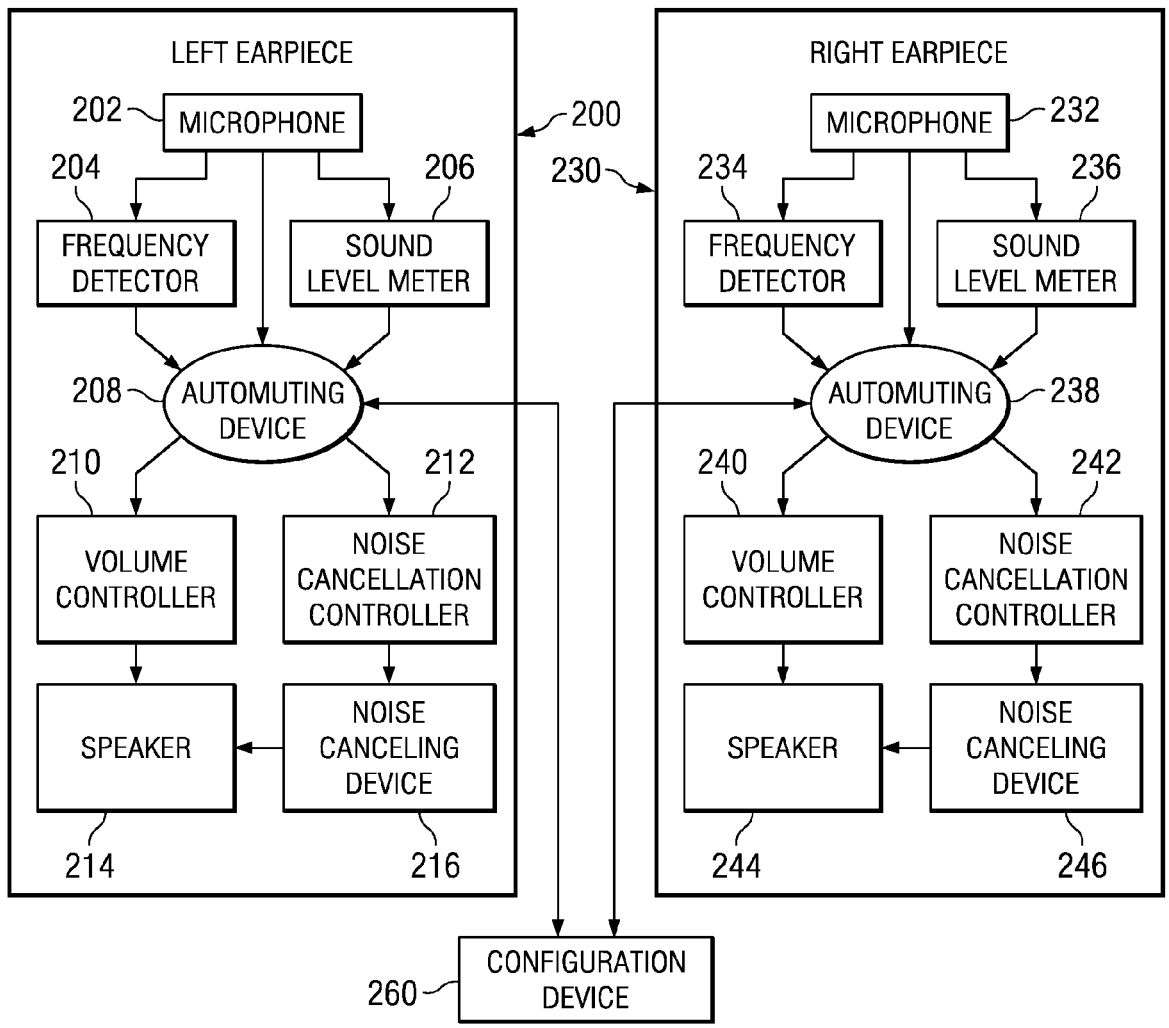
FIG. 2 is a schematic of a headphone connected to a configuration device, in accordance with an illustrative embodiment.

FIG. 2 is a schematic of a headphone connected to a configuration device, in accordance with an illustrative embodiment. FIG. 2 includes left earpiece 200, right earpiece 230, and configuration device 260. Left earpiece 200 and right earpiece 230 are similar to left earpiece 142 and right earpiece 144, respectively, of FIG. 1. Left earpiece 200 and right earpiece 230 are components of a headphone, such as headphone 110 of FIG. 1, and emanate an audio signal to a user from an audio player, such as audio player 130 of FIG. 1.

Left earpiece 200 emanates an audio signal to the left ear of a user. Left earpiece 200 includes microphone 202, frequency detector 204, sound level meter 206, automuting device 208, volume controller 210, noise cancellation controller 212, speaker 214, and noise canceling device 216. Microphone 202 is a transducer that captures a sound wave external to the headphone and converts the sound wave into an electrical signal. In the illustrative embodiment, microphone 202 detects sounds ranging anywhere from 35 dB to 75 dB and 300 Hz to 4500 Hz. However, microphone 202 is not limited to the illustrative embodiment and may include a lesser or wider range of sounds.

Microphone 202 connects to frequency detector 204, sound level meter 206, and automuting device 208. Frequency detector 204 is a device that determines the pitch of a sound. Frequency detector 204 measures the pitch in Hertz (Hz). In the illustrative embodiment, frequency detector 204 measures the frequency of the sound captured by microphone 202.

Sound level meter 206 is a device that detects the sound pressure level of a sound. The sound pressure level indicates the intensity, also referred to as the volume, of a sound. Sound level meter 206 measures the sound pressure level in decibels (dB). In the illustrative embodiment, sound level meter 206 measures the volume or loudness of the sound captured by microphone 202.

Frequency detector 204 and sound level meter 206 transmit the frequency and the volume, respectively, of the captured sound in the form of a signal to automuting device 208. Automuting device 208 also receives a communication from configuration device 260 indicating the frequency threshold and the volume threshold either established by a user or established through the default settings in configuration device 260. Automuting device 208 utilizes the received signals and communication to determine whether the sound captured by microphone 202 is a sound of interest.

In use, automuting device 208 compares the frequency of the captured sound against a frequency threshold to determine whether the sound falls within the established frequency threshold range. Automuting device 208 also compares the volume of the captured sound against the volume threshold. If the frequency falls within the frequency threshold range and the volume is above the volume threshold, then automuting device 208 concludes that the captured sound is a sound of interest.

In the illustrative embodiment, automuting device 208 is a data processing system which employs a computer program product comprising a computer-usable medium having a computer-readable program to determine whether the sound is a human voice in close proximity to the headphone. However, in another embodiment, automuting device 208 can also be a mechanical control, such as a circuit connected to a potentiometer or the processor of a data processing system.

After automuting device 208 concludes that the captured sound is a sound of interest, automuting device 208 forms a command to mute the headphone. The command to mute includes a communication to either deactivate speaker 214 in left earpiece 200 or deactivate the audio player. The command to mute also includes a communication to deactivate any active noise cancellation feature.

In the illustrative embodiment, automuting device 208 transmits the command to mute to volume controller 210 and noise cancellation controller 212. In another embodiment, automuting device 208 may also transmit a command to the audio device to turn "off" any sound emanating from the audio device. Automuting device 208 may transmit the command directly to the audio device or via configuration device 260.

Volume controller 210 is any digital or analog device used to control the loudness of a sound. In one embodiment, volume controller 210 is a data processing system in which a user adjusts sound loudness using a user interface, such as a touch screen. In another embodiment, volume controller 210 is a mechanical control, such as a knob, dial, button, or set of buttons. Depending on implementation, volume controller 210 may be a separate device or may be combined with automuting device 208. In the illustrative embodiment, volume controller 210 is a data processing system that is part of automuting device 208.

Volume controller 210 connects to speaker 214 and adjusts the loudness with which a sound is transmitted through speaker 214. Volume controller 210 can incrementally adjust the loudness or simply turn "on" or "off" any sound transmitted from the audio device. When volume controller 210 receives the command to mute, volume controller 210 turns "off" any sound emanating from speaker 214.

Noise cancellation controller 212 is a digital or mechanical device that detects and blocks out a sound. Noise cancellation controller 212 can be implemented as, but is not limited to, a data processing system or a circuit. Noise cancellation controller 212 connects to noise canceling device 216 and controls the status of the noise cancellation feature of the headphone. Noise canceling device 216 includes a microphone connected to an electronic circuit. The microphone receives a sound wave external to the headphone. The electric circuit then transmits a sound wave having an opposite polarity of the sound wave captured by the microphone. The opposite polarity creates a destructive interference, thereby canceling out any noise within left earpiece 200. In the illustrative embodiment, noise canceling device 216 may include a separate microphone or may utilize microphone 202. When noise cancellation controller 212 receives the command to mute, noise cancellation controller 212 deactivates the sound wave being transmitted from noise canceling device 216.

In the illustrative embodiment, right earpiece 230 is similar to left earpiece 200, except that right earpiece 230 emanates an audio signal to the right ear of a user. Right earpiece 230 includes microphone 232, frequency detector 234, sound level meter 236, automuting device 238, volume controller 240, noise cancellation controller 242, speaker 244, and noise canceling device 246. Microphone 232 captures a sound external to the headphone and converts the sound to an electrical signal. Microphone 232 then transmits the electrical signal to frequency detector 234, sound level meter 236, and automuting device 238. Frequency detector 234 measures the frequency of the sound captured by microphone 232. Sound level meter 236 measures the volume of the sound captured by microphone 232. Frequency detector 234 and sound level meter 236 then transmit the frequency and the volume, respectively, to automuting device 238. In the illustrative embodiment, automuting device 238 is a data processing system which employs a computer program product comprising a computer-usable medium having a computer-readable program to determine whether the sound is a sound of interest.

Automuting device 238 also receives a communication from configuration device 260 indicating the frequency threshold and the volume threshold either established by a user or established through the default settings in configuration device 260. Automuting device 238 utilizes the received signal and communication to determine whether the sound captured by microphone 232 is a sound of interest.

After automuting device 238 concludes that the captured sound is a sound of interest, automuting device 238 forms a command to mute the headphone. In the illustrative embodiment, automuting device 238 transmits the command to mute to volume controller 240 and noise cancellation controller 242. When volume controller 240 receives the command to mute, volume controller 240 turns "off" any sound emanating from speaker 244. When noise cancellation controller 242 receives the command to mute, noise cancellation controller 242 deactivates the sound wave being transmitted from noise canceling device 246.

In the illustrative embodiment, left earpiece 200 and right earpiece 230 can automatically mute the headphone either independent of or in conjunction with each other. In one embodiment, both automuting device 208 and automuting device 238 each independently determine whether a sound is a sound of interest. In another embodiment, either automuting device 208 or 238 makes the determination and then transmits the conclusion to the other automuting device, 238 or 208. The other automuting device, 238 or 208, receives the communication and proceeds to form and transmit a command to mute the headphone. In yet another embodiment, only one earpiece includes the components necessary to make the determination. For example, only left earpiece 200 includes microphone 202, frequency detector 204, sound level meter 206, automuting device 208, volume controller 210, noise cancellation controller 212, speaker 214, and noise canceling device 216. Right earpiece 230 only includes the components necessary to mute the headphone. Therefore, after left earpiece 200 makes the determination that the captured sound is a sound of interest, left earpiece 200 transmits a communication to right earpiece 230 so that right earpiece 230 can issue a command to mute the headphone.

In the illustrative embodiment, configuration device 260 connects to both automuting devices 208 and 238. In the illustrative embodiment, configuration device 260 is a data processing system. Configuration device 260 transmits the volume and frequency thresholds to automuting devices 208 and 238. The volume and frequency thresholds can be established by a user of the headphone or through the default settings stored in the memory of configuration device 260. In the illustrative embodiment, configuration device 260 connects to both left earpiece 200 and right earpiece 230. In another embodiment, configuration device 260 may connect to only one earpiece, either left earpiece 200 or right earpiece 230. In yet another embodiment, each earpiece, 200 or 230, may each have an independent, separate configuration device 260.

Left earpiece 200 and right earpiece 230 are not limited to the illustrative embodiments. For example, left earpiece 200 and right earpiece 230 may include more or fewer components. Additionally, left earpiece 200 and right earpiece 230 may be part of an audio only or a noise canceling only headphone. In other words, in another embodiment, left earpiece 200 and right earpiece 230 do not need to include both the audio and noise cancellation features. Left earpiece 200 and right earpiece 230 may include one or the other. Furthermore, left earpiece 200 and right earpiece 230 do not need to include the same features. Thus, for example, left earpiece 200 may include both the audio and noise cancellation features, while right earpiece 230 may only include the audio feature. In another example, left earpiece 200 may include the audio feature, while right earpiece may include the noise cancellation feature.

Figure 3:
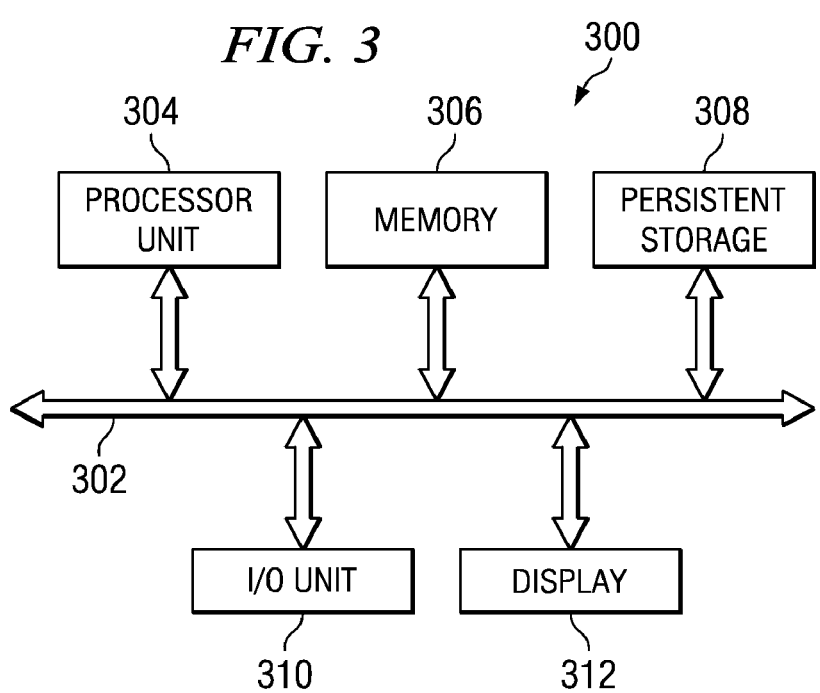
FIG. 3 depicts a block diagram of a data processing system, in accordance with an illustrative embodiment.

Turning now to FIG. 3, a block diagram of a data processing system is depicted in accordance with an illustrative embodiment. Data processing system 300 can be implemented as an automuting device, such as automuting devices 208 and 238 of FIG. 2, or as a configuration device, such as configuration device 120 of FIG. 1 and configuration device 260 of FIG. 2.

In this illustrative example, data processing system 300 includes communications fabric 302, which provides communications between processor unit 304, memory 306, persistent storage 308, I/O unit 310, and display 312. Processor unit 304 serves to execute instructions for software that may be loaded into memory 306. Processor unit 304 may be a set of one or more processors or may be a multi-processor core, depending on the particular implementation. Further, processor unit 304 may be implemented using one or more heterogeneous processor systems in which a main processor is present with secondary processors on a single chip. Memory 306 may be, for example, a random access memory. Persistent storage 308 may take various forms depending on the particular implementation. For example, persistent storage 308 may be, for example, a hard drive, a flash memory, a rewritable optical disk, a rewritable magnetic tape, or some combination of the above. I/O unit 310 allows for input and output of data with other devices that may be connected to data processing system 300. For example, I/O unit 310 may provide a connection for a user to connect a configuration device to a headphone. Additionally, I/O unit 310 may provide a means for a user to configure settings through a keyboard and mouse for a configuration device. Furthermore, I/O unit 310 may send output to a configuration device. Display 312 provides a mechanism to display information to a user. Display 312 may be a screen or a touch screen.

Instructions for the operating system and applications or programs are located on persistent storage 308. These instructions may be loaded into memory 306 for execution by processor unit 304. The processes of the different embodiments may be performed by processor unit 304 using computer implemented instructions, which may be located in a memory, such as memory 306.

The hardware shown in FIG. 3 may vary depending on the implementation of the illustrated embodiments. Other internal hardware or peripheral devices, such as flash memory, equivalent non-volatile memory, or optical disk drives and the like, may be used in addition to or in place of the hardware depicted in FIG. 3. Additionally, the processes of the illustrative embodiments may be applied to a multiprocessor data processing system.

The systems and components shown in FIG. 3 can be varied from the illustrative examples shown. Depending on implementation, data processing system 300 may include more or fewer systems or components. In some illustrative examples, data processing system 300 may be a personal digital assistant (PDA). A personal digital assistant generally is configured with flash memory to provide a non-volatile memory for storing operating system files and/or user-generated data. Additionally, data processing system 300 can be a tablet computer, laptop computer, or telephone device.

Other components shown in FIG. 3 can be varied from the illustrative examples shown. For example, a bus system may be comprised of one or more buses, such as a system bus, an I/O bus, and a PCI bus. Of course the bus system may be implemented using any suitable type of communications fabric or architecture that provides for a transfer of data between different components or devices attached to the fabric or architecture. Additionally, a communications unit may be included and may include one or more devices used to transmit and receive data, such as a modem or a network adapter. Further, a memory may be, for example, memory 306 or a cache.

The depicted examples in FIG. 3 are not meant to imply architectural limitations. In addition, the illustrative embodiments provide for a computer implemented method, apparatus, and computer usable program code for compiling source code and for executing code. The methods described with respect to the depicted embodiments may be performed in a data processing system, such as data processing system 300 shown in FIG. 3.

FIG. 4 is a flowchart illustrating the process for automatically muting a headphone, in accordance with an illustrative embodiment. The following process is exemplary only and the order of each step may be interchanged without deviating from the scope of the invention. The process is executed in an automuting device, such as automuting device 208 or 238 of FIG. 2.

The process begins with the automuting device receiving a volume value from a sound level meter (step 400). The automuting device next receives a frequency value from a frequency detector (step 410). The automuting device then receives a volume threshold and a frequency threshold range from a configuration device (step 420).

The automuting device then compares the volume threshold against the volume value (step 430). A determination is then made as to whether the volume value is above the volume threshold (step 440). If the volume value is below the volume threshold ("no" output to step 440), the process terminates.

If the volume value is above the volume threshold ("yes" output to step 440), then the frequency threshold range is compared against the frequency value (step 450). A determination is then made as to whether the frequency value falls within the frequency threshold range (step 460). If the frequency value is outside the frequency threshold range ("no" output to step 460), the process terminates.

If the frequency value is within the frequency threshold range ("yes" output to step 460), then a command is formed to mute the headphone (step 470). The command to mute the headphone is then transmitted (step 480), with the process terminating thereafter.

The illustrative embodiments provide a method and system for automatically muting a headphone. A microphone in the headphone detects a sound external to the headphone. An automuting device in the headphone receives a volume threshold and a frequency threshold range from a configuration device. The volume threshold and the frequency threshold range define a sound of interest. The volume threshold and the frequency threshold range are adjustable and set using the configuration device. The configuration device may be either a data processing system or a mechanical control.

A determination is made as to whether the sound external to the headphone is a sound of interest. In response to a determination that the sound external to the headphone is the sound of interest, the automuting device transmits a signal to automatically mute an active state of the headphone. In one embodiment, an active state of the headphone is an audio player transmitting a sound signal. In another embodiment, an active state is an active noise cancellation feature.

The illustrative embodiments allow a user to block out unwanted background noise, while simultaneously allowing for some specific sounds that are external to the headphone to be brought to the attention of the user. Therefore, the user can program the illustrative embodiments to mute the headphone in emergency situations or in situations in which another individual is trying to communicate with the user. Additionally, the illustrative embodiments allow a user to immediately begin a conversation with another individual without having to take additional steps to remove or unplug the headphones, stop any music or sounds emanating from the headphones, or deactivate an active noise cancellation feature.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for automatically muting a headphone, the method comprising:
    detecting, by a microphone, a sound external to the headphone;
    receiving, by a configuration device, a volume threshold and a frequency threshold, wherein the volume threshold and the frequency threshold define a sound of interest;
    determining, by an automuting device, whether the sound external to the headphone is the sound of interest; and
    responsive to a determination, by the automuting device, that the sound external to the headphone is the sound of interest, transmitting, by the automuting device, a first signal to automatically mute an active noise cancellation feature of the headphone and a second signal to automatically mute an audio player transmitting a sound signal.

2. The method of claim 1, wherein the volume threshold and the frequency threshold are adjustable.

3. The method of claim 1, wherein the volume threshold and the frequency threshold are set using the configuration device, wherein the configuration device is a data processing system or a mechanical control.

4. The method of claim 1, wherein the transmitting the first signal to automatically mute the active noise cancellation feature of the headphone comprises:
    transmitting the first signal to automatically mute the active noise cancellation feature of the headphone for an established time limit.

5. A headphone comprising:
    a microphone operative to detect a sound external to the headphone;
    a configuration device connected to the headphone, wherein the configuration device is operative to set a volume threshold and a frequency threshold, wherein the volume threshold and the frequency threshold define a sound of interest; and
    an automuting device connected to the microphone and the configuration device, wherein the automuting device is operative to determine whether the sound external to the headphone is a sound of interest, and wherein the automuting device is operative to transmit a first signal to automatically mute an active noise cancellation feature of the headphone and a second signal to automatically mute an audio player transmitting a sound signal in response to determining that the sound external to the headphone is the sound of interest.

6. The headphone of claim 5, wherein the volume threshold and the frequency threshold are adjustable.

7. The headphone of claim 5, wherein the configuration device is a data processing system or a mechanical control.

8. The headphone of claim 5, wherein the automuting device is operative to transmit the first signal to automatically mute the active noise cancellation feature of the headphone for an established time limit.

* * * * *